United States Patent [19]

Hawley

[11] 4,318,175
[45] Mar. 2, 1982

[54] ADDRESSING MEANS FOR RANDOM ACCESS MEMORY SYSTEM

[75] Inventor: Kenneth R. Hawley, Ventura, Calif.

[73] Assignee: Bunker Ramo Corporation, Oak Brook, Ill.

[21] Appl. No.: 66,242

[22] Filed: Aug. 13, 1979

[51] Int. Cl.³ .............................................. G06F 9/36
[52] U.S. Cl. ................................................... 364/200
[58] Field of Search ... 364/200 MS File, 900 MS File

[56] References Cited

U.S. PATENT DOCUMENTS

| | | | |
|---|---|---|---|
| 4,005,389 | 1/1977 | Penzel | 364/900 |
| 4,024,509 | 5/1977 | Elmer | 364/200 |
| 4,037,215 | 7/1977 | Birney et al. | 364/200 |
| 4,048,624 | 9/1977 | Cochran et al. | 364/900 |
| 4,118,773 | 10/1978 | Raguin et al. | 364/200 |

Primary Examiner—Gareth D. Shaw
Assistant Examiner—C. T. Bartz
Attorney, Agent, or Firm—F. M. Arbuckle; A. Freilich

[57] ABSTRACT

A method and apparatus for addressing memory locations in a random access memory system having m address lines and 2 Exp(m+n) address locations. The random access memory system is divided into a plurality of 2 Exp(n) memory modules, each memory module having 2 Exp(m) memory locations. Each of the memory modules is divided into 2 Exp(n) groups of 2 Exp(m−n) memory locations. In a specific embodiment in which m=15 and n=4, each memory module contains 2 Exp(15) or 32,768 address locations, and the sixteen memory modules together contain 524,288 address locations. Each memory module is divided into 2 Exp(4) or sixteen groups of memory locations. The first or most significant 4 bits of a 15 bit address word are used to address one of the sixteen groups of memory locations and also to address a particular memory module containing the addressed group. This is accomplished in an address translation logic unit which is preprogrammed so that the first four bits enable a particular memory module containing the addressed group of memory locations. Thus, the first four bits actually are used to address 256 possible groups of memory locations (sixteen groups in each of sixteen memory modules). By appropriately programming the address translation logic unit, sixteen groups of discontinuous memory spaces in the sixteen memory modules can be directly accessed by a computer central processing unit (CPU).

10 Claims, 5 Drawing Figures

ADDRESSING MEANS FOR RANDOM ACCESS MEMORY SYSTEM

BACKGROUND OF THE INVENTION

The invention relates to methods and apparatus for addressing memory locations in a random access memory system.

Many conventional computer memory systems have a predetermined number of address lines capable of addressing a plurality of memory locations within a memory unit. For example, an address byte comprising m bits of information on m address lines is capable of addressing 2 Exp(m) memory locations. Thus as memory expansion occurs, more and more address lines are required to address the expanded number of memory locations. However, a particular application program generally does not address all of the memory locations available, and frequently the addressed memory locations are concentrated in specific and often contiguous portions of the available memory space. There has long been a need in the computing sciences to provide rapid access to a large number of memory locations while at the same time, minimizing the number of address lines or bits required to define each memory location. In addition, there has been a need to differentiate between CPU and I/O device memory requests so that identical address bit patterns can address different physical memory locations in accordance with the type of requesting device. The present invention provides a means for rapidly defining and redefining portions of the total memory space which contain a plurality of memory locations which can be identified by the number of address lines available. In addition, the invention provides a means whereby different memory locations can be accessed with the same address bit pattern according to the type of requesting device.

SUMMARY OF THE INVENTION

The invention provides a memory addressing system having m address lines or bits which can be used to address 2 Exp(m+n) memory locations, n being less than m. This is accomplished by dividing the 2 Exp(m+n) memory locations into 2 Exp(n) memory modules, each module having 2 Exp(m) memory locations. The m address bits or lines are divided into two groups, the first group having n lines and the second group having m−n lines. Each of the 2 Exp(n) memory modules contains a random access memory (RAM) which is divided into 2 Exp(n) groups of addressable memory locations, each group having 2 Exp(m−n) memory locations. A means is provided by the invention for the n address bits to identify both the memory module and the group of memory locations to be addressed.

In a specific embodiment, m=15 and n=4. Thus, each memory module has 2 Exp(15) or 32,768 memory locations, and 2 Exp(n) or sixteen modules together have 524,288 memory locations. The address lines are divided so that the same bit pattern on the first four lines define both the memory module and group of memory locations to be addressed, the remaining eleven lines defining which of the 2,048 memory locations within the selected module and group of memory locations is to be addressed. The invention provides a plurality of bit map registers each of which is associated with one of the memory modules. Each bit map register contains 2 Exp(n) memory locations. In accordance with a predetermined memory resource allocation table developed for the particular program to be run, each bit map register location is programmed with either a logic one or zero. The n bits identifying the group of memory locations to be selected also addresses a corresponding memory location in each bit map register. Whenever that location contains a one, or a zero depending on the logic being utilized, it enables its corresponding memory module. Thus, in accordance with the memory resource allocation table which is developed in the CPU of a computing system, the correct memory module containing the desired group of memory locations is enabled. If that same group of memory locations in another memory module is desired, then the bit map register locations would have to be reprogrammed. For example, if it is desired to address the fourth group of memory locations on the eighth memory module then the bit map register associated with the eighth memory module will have a one programmed in its fourth memory location, and all the other bit map registers would have zeroes programmed in their fourth memory locations. Thus, a 0100 pattern on the first four address lines will enable the eighth memory module and address the fourth group of memory locations within that module. The remaining eleven bits on the eleven other address lines identify a memory location within the selected group. Thus, the invention provides a means for dividing a large random access memory system into portions which in total have address locations corresponding to the number of address lines available. As soon as additional memory is required, the central processing unit defines another block of memory locations by reprogramming the various bit map registers.

Additional features of the invention include a means whereby an input/output (I/O) device or system can also have access to the random access memory through the same address lines utilized by the CPU. This is accomplished by programming a second set of bit map registers as above described, then selecting which set of registers is to be utilized. Selection is made by a signal appearing on an I/O select line. Thus, identical addresses can access different memory locations within the memory system, the specific memory location being determined by the type of requesting device. The invention also provides a means whereby all RAM's in the memory modules are disabled whenever power is removed from the system.

DETAILED DESCRIPTION

Detailed illustrative embodiments of the invention disclosed herein exemplify the invention and are currently considered to be the best embodiments for such purposes. However, it is to be recognized that other methods of partitioning the total number of memory locations, memory modules, and groups of memory locations could be utilized. Accordingly, the specific embodiments disclosed are only representative in providing a basis for the claims which define the scope of the present invention.

As previously explained, the invention provides a memory addressing method and apparatus in which m address lines are utilized to address $2 \operatorname{Exp}(m+n)$ memory locations. The $2 \operatorname{Exp}(m+n)$ memory locations are divided into $2 \operatorname{Exp}(n)$ memory modules each of which includes a random access memory (RAM) having $2 \operatorname{Exp}(m)$ memory locations. Each RAM is divided into $2 \operatorname{Exp}(n)$ groups of memory locations, each group having $2 \operatorname{Exp}(m-n)$ specific word locations. In addition, each memory module has an associated bit map register each having $2 \operatorname{Exp}(n)$ memory locations programmed in accordance with a predetermined memory resource allocation table to be explained below. The m address lines are divided into two groups comprising n and m−n lines. The n lines define both the memory module to be addressed and a group of memory locations within the RAM of the addressed memory module. The bit map register memory locations are programmed in accordance with a program to be run so that the n lines defining the group of memory locations also define a specific memory location in each bit map register. The bit map register having a one in an addressed memory location enables its corresponding RAM. Thus in developing a program to be run, the central processing unit (CPU) determines the order in which each of the memory modules will be enabled and the group of memory locations within the RAM of the enabled memory module which will be addressed. Based on this information, the CPU develops a memory resource allocation table from which the bit map register memory locations for each memory module are programmed. In accordance with another embodiment of the invention, a means is provided whereby an I/O device through another set of independently programmed bit map registers can have access to the plurality of memory modules.

Figure 1:
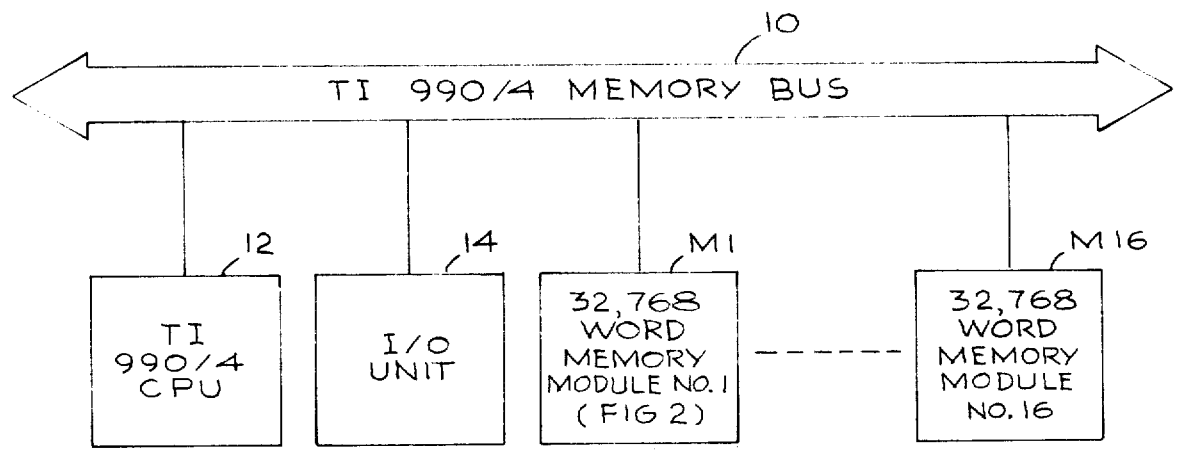
FIG. 1 is a diagrammatic representation showing a computer memory address and data bus interconnecting a central processing unit, an I/O device and sixteen memory modules.

Referring now to FIG. 1, a TI 990/4 memory bus 10 is provided, the bus 10 providing access to a TI 990/4 central processing unit (CPU) 12, an input/output (I/O) unit 14, and sixteen memory modules M1-M16. Although the TI 990/4 CPU 12 and memory bus 14 are used for illustrative purposes, the invention is not limited to this specific computing system and any computer and associated memory bus could be utilized. The memory modules M1-M16 each comprise $2 \operatorname{Exp}(15)$ or 32,768 memory locations contained in an associated random access memory (RAM). Thus, the total number of memory locations in the sixteen memory modules M1-M16 is $2 \operatorname{Exp}(19)$ or 524,288 locations. The TI 990/4 memory bus 10 is limited to fifteen address lines, thus providing $2 \operatorname{Exp}(15)$ or 32,768 individual addresses. The purpose of the invention is to allow access to the $2 \operatorname{Exp}(19)$ memory locations through the use of $2 \operatorname{Exp}(15)$ address lines. Although sixteen memory modules each having a capacity of $2 \operatorname{Exp}(15)$ words and fifteen address lines are utilized in this exemplary embodiment, it should be understood that other combinations of memory modules, address lines and number of memory locations could also be utilized in accordance with the teachings of the invention. The invention is especially useful when the number of address lines within a memory bus is less than the number of word locations available within a memory system. As will become apparent below, the invention provides a means for accessing $2 \operatorname{Exp}(m)$ memory locations within a random access memory system using n address lines wherein n is less than m.

Figure 2:
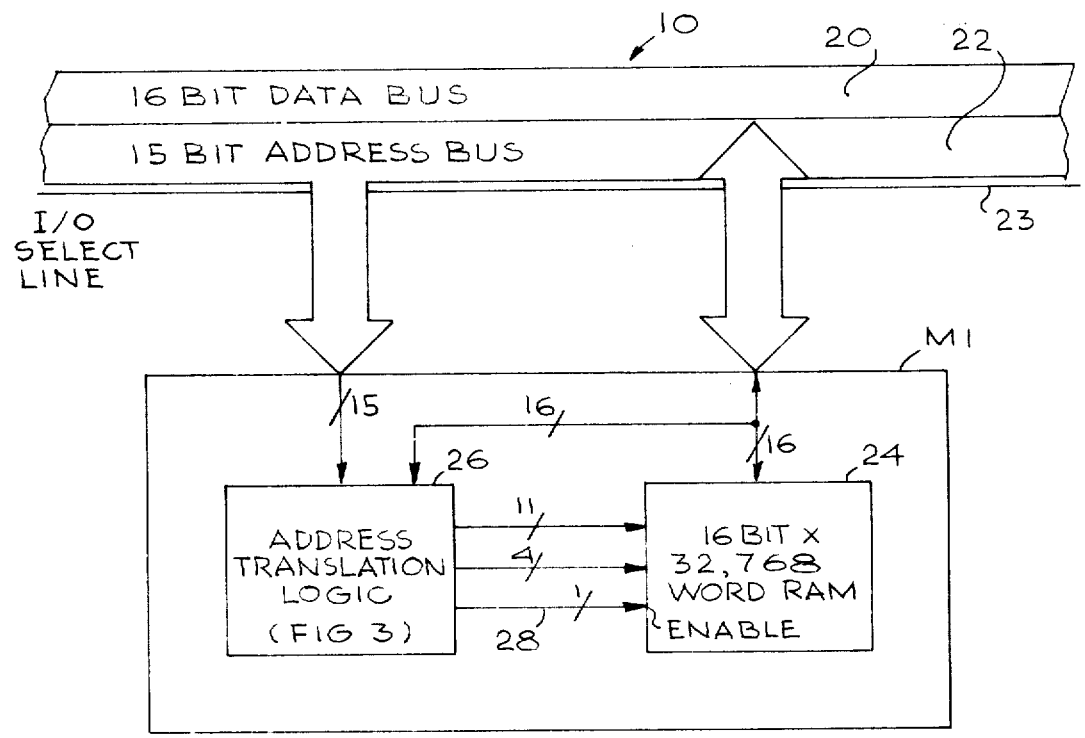
FIG. 2 is a block diagram of the memory module and its interfaces to the address and data bus.

The first memory module M1 can be seen in greater detail by referring to FIG. 2. As can be seen, the memory bus 10 comprises a sixteen bit data bus 20, a fifteen bit address bus 22, and an I/O select line 23 to be explained below. The memory module M1 comprises a sixteen bit by 32,768 word random access memory (RAM) 24 and an address translation logic unit 26. The fifteen address lines from the address bus 22 are divided into two groups of four and eleven lines within the address translation logic unit 26, the first four lines identifying a group of memory locations within the RAM 24 and the remaining eleven lines addressing a specific memory location in the identified group of memory locations. The data bus 20 is also connected to the RAM 24 and to the address translation logic unit 26 for reasons to be explained below. Identical memory modules are provided for memory modules M2-M16, sixteen modules being chosen as the maximum number of modules which can be separately identified by four lines from the address bus 22. The RAM 24 is divided into $2 \operatorname{Exp}(n)$ or sixteen groups of memory locations, each group containing 2,048 words. Thus, four address lines can define any one of the sixteen 2,048 word location groups and any one of the sixteen memory modules M1-M16. The invention provides a means whereby the same four bits on the first four address lines can be used to define which RAM within the memory modules M1-M16 is to be enabled, and which of the sixteen groups of memory locations within the enabled RAM is to be addressed. An enabling signal, when generated, is provided to the RAM 24 on an enabling line 28.

Figure 3:
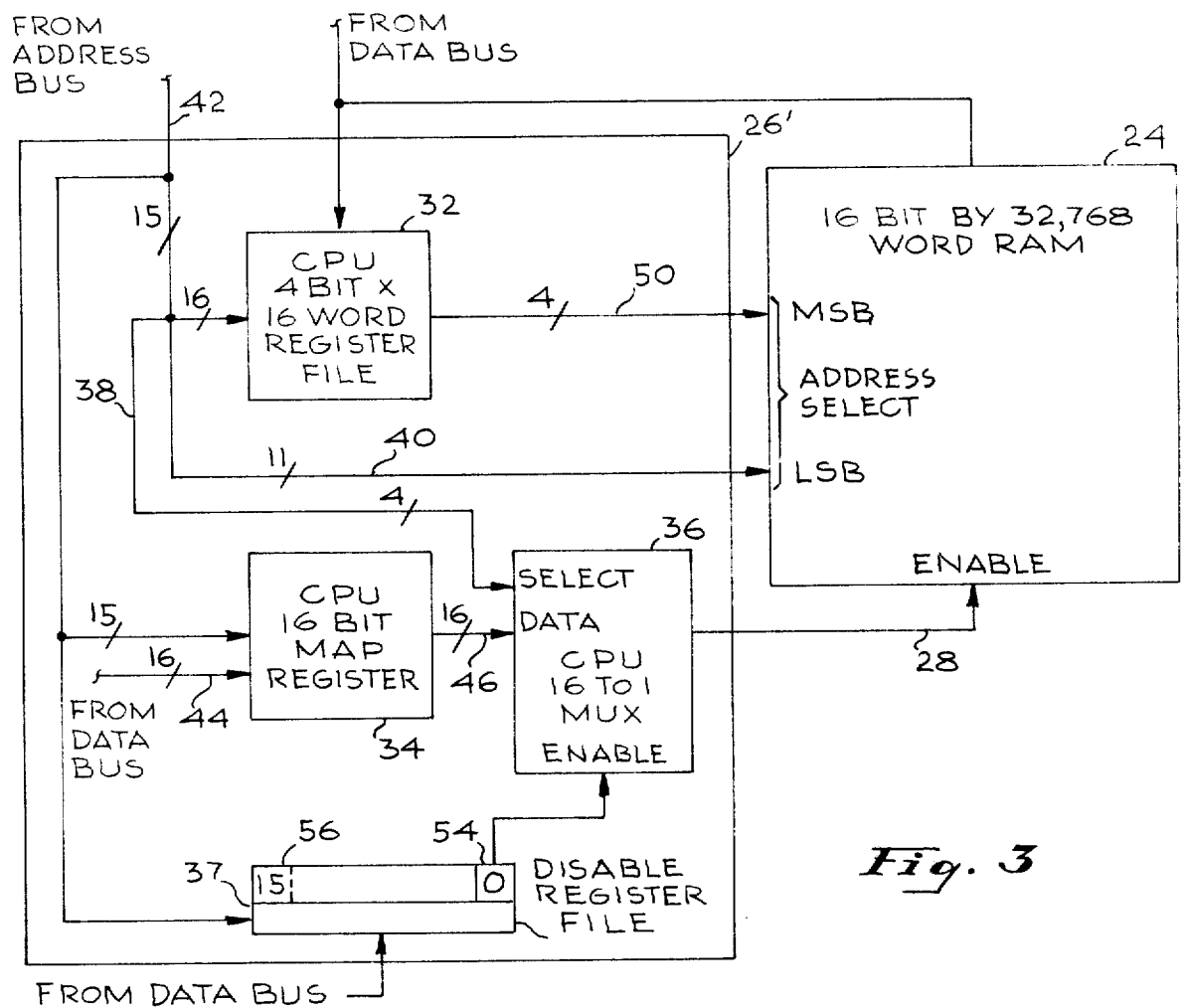
FIG. 3 is a block diagram of an address translation logic unit.

A first embodiment of the address translation logic unit 26' can be seen in FIG. 3. The address translation logic unit 26' comprises a CPU four bit by sixteen word register file 32, a CPU sixteen bit map register 34, a CPU sixteen to one multiplexer circuit 36, and a CPU multiplexer disable register 37.

In operation, fifteen lines from the address bus 42 enter the address translation logic unit 26' and are provided to the CPU register file 32. The first four lines 38 are also provided to the multiplexer circuit 36. These four lines are chosen as the first four address lines or four most significant bit lines of the incoming address bus. However, any four lines could have been chosen. The remaining eleven lines 40 are provided directly to the RAM 24. For a specific program to be run, the CPU bit map register 34 is initially addressed by a predetermined address word on the fifteen address lines shown at 42, and then programmed by a sixteen bit word from the data bus shown at 44, one bit being stored in each of the register 34 memory locations. The contents of each memory location is provided on sixteen lines 46 to the multiplexer circuit 36. The memory location defined by the first four address lines 38 identifies one of the sixteen bit map register output lines 46. If the identified output line is connected to a bit map register memory location programmed with a one, then the RAM 24 will be enabled. If that memory location is programmed with a zero, then the RAM 24 will not be enabled. However, that same memory location in another bit map register may contain a one, thereby enabling its associated RAM. Thus, the four bit byte defined on the first four incoming address lines 38 defines which memory module RAM will be enabled by selecting one of the sixteen memory locations in each bit map register, the particular RAM being enabled depending on which of the sixteen selected memory locations contains a one. For example, if the bit pattern defined on the first four address lines consisted of 0111, then memory location seven of the bit map register 34 will be accessed by the multiplexer circuit 36. If, in accordance with the predetermined memory resource allocation table, memory location seven corresponds to the first memory module M1 and contains a one, then the first memory module RAM 24 would be enabled by a signal provided to the RAM enabling line 28. As previously explained, only one bit map register location corresponding to a bit pattern of 0111 can contain a one, the remaining fifteen bit locations corresponding to 0111 having zeroes.

The CPU register file 32 is also initially addressed by a predetermined address word on the fifteen address lines shown at 42, and then programmed by a sixteen bit word from the data bus shown at 44. This programming defines the group of memory locations in the RAM 24 to be addressed by digital signals on the first four address lines 38. Four bits on four group identifier lines 50 from the CPU register file 32 identifies one of the 2 Exp(n) or sixteen groups of memory locations to be accessed in the enabled RAM 24. As one can appreciate, the register file 32 could be programmed to have any of the sixteen groups of memory locations within the RAM 24 correspond to any input on the four address lines 38. The eleven lines shown at 40 define which of the 2,048 memory locations within the selected group of memory locations is to be addressed. As long as the same group of memory locations within different memory modules is not to be accessed, the word registers and bit map registers can define sixteen groups of memory locations comprising 32,768 memory locations from the 524,288 memory locations contained in memory modules M1–M16. Whenever memory locations contained in more than the sixteen defined groups of memory locations are required, or the same group of memory locations within different RAMs are required, the CPU must reprogram the bit map registers 34, and the four x sixteen word register file 32 thereby defining a second block of memory locations. The matrix developed by the CPU which identifies a specific group of memory locations to be addressed and a specific RAM to be enabled is referred to as the memory resource allocation table.

The CPU multiplexer disable register 37 has a memory location corresponding to each of the sixteen CPU sixteen to one multiplexer circuits 36. The disable register 37 is distributed among the address translation logic units 26' so that there is one memory location per memory module. Thus, for the first memory module M1, a first memory location 54 is provided and for the last memory module M16 a sixteenth memory location 56 is provided as shown in phantom. The disable register 37 has a unique address, and when addressed by the CPU, receives a sixteen bit data word on data lines 58. If the first memory location 54, for example, is programmed with a one, then the CPU multiplexer circuit in the first memory module M1 will be enabled, thereby allowing its corresponding RAM to be enabled if the appropriate bit map register output line is selected by the first four address bits. The module disable register provides a means whereby all of the RAM's can be disabled in the event of power removal, or power drop-outs, merely by causing all the memory locations in the disable register file to be set to zero.

In the embodiment above described, 273 memory locations control access to the 524,288 memory locations provided by the sixteen memory modules M1–M16. Each of the sixteen memory modules requires sixteen locations for the word register file 32 and one memory location for the bit map register 34, or a total of 272 memory locations. One additional memory location is required for the disable register 37. To summarize, as one can now appreciate, bus addresses are translated so that physically discontiguous memory space may be accessed as contiguous bus addresses. This feature allows for a single disk transfer to move up to sixteen blocks of data from different areas of physical memory in a single transfer. In some conventional systems, multiple disk transfers are required for task loading unless the task is in physically contiguous memory space.

Figure 4:
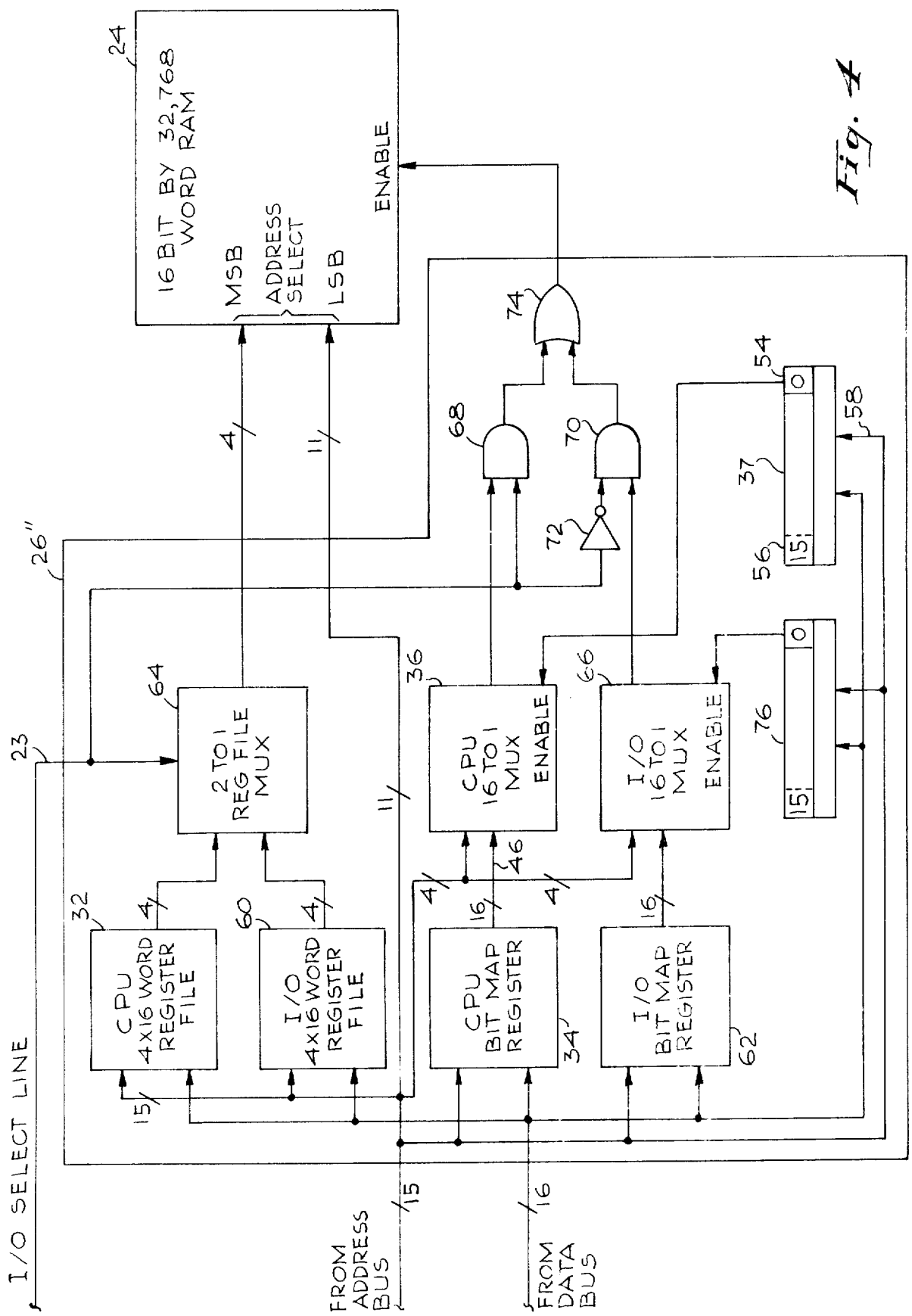
FIG. 4 is a further embodiment of the address translation logic unit in which both the central processing unit and I/O device can address the sixteen memory modules.

In a further embodiment of the address translation logic unit 26, access to the sixteen memory modules M1–M16 through the fifteen bit address bus 22 by an I/O device 14 can also be obtained. Referring to FIG. 4, an address translation logic unit 26" is shown which has the same CPU four×sixteen word register file 32 and CPU bit map register 34 as in the previous embodiment. The CPU bit map register 34 interfaces with the CPU sixteen to one multiplexer circuit 36 as previously explained. As shown in FIG. 2, the memory bus 10 contains an I/O select line 23 which provides a signal utilized by the address translation logic unit 26" to determine whether the CPU 12 or an I/O device 14 is addressing the memory modules M1–M16. Additional units within the address translation logic unit 26" include an I/O four×sixteen word register file 60, an I/O bit map register 62, a two to one register file multiplexer 64, and an I/O sixteen to one multiplexer circuit 66 for use in conjunction with the I/O bit map register 62. Logic elements, to be explained below, include a CPU select AND gate 68, an I/O select AND gate 70, an inverter 72, and an enabling OR gate 74. In addition, an I/O multiplexer disable register file 76 is provided for disabling the multiplexer circuits as previously explained for the CPU disable register 37.

The address translation logic unit 26" operates as described in conjunction with the FIG. 3 embodiment when a high or one signal is present on the I/O select line 23, a one indicating CPU access is desired and a zero indicating I/O access is desired. Of course, the address translation logic unit 26" could be configured so that a zero indicates CPU access is desired and a one indicates that I/O access is desired. If CPU access to the memory modules is desired, the high signal appearing on the I/O select line 23 configures the two to one register file multiplexer 64 to connect the output of the CPU four×sixteen word register file 32 to the random access memory 24. This high signal also provides one input to the CPU select AND gate 68, the other input being the contents of the memory location connected to the selected bit map register output line. If the selected output line contains a one, then the output of CPU select AND gate 68 will enable the RAM 24 through the enabling OR gate 74. In addition, the high signal on the I/O select line is inverted by the inverter 72 thereby disabling the I/O select AND gate 70.

If it is desired that the I/O unit 14, which of course could comprise a plurality of I/O devices at different locations, have access to the memory modules M1–M16, the signal appearing on the I/O select line 23 will be low. This low signal configures the two to one register file multiplexer 64 so that the output of the I/O four×sixteen word register file 60 is connected to the RAM 24. The low signal on the I/O select line 23 also disables the CPU select AND gate 68 and, through the inverter 72, provides a high input to the I/O select AND gate 70. Thus, when an address on the fifteen bit address bus 22 enters the address translation logic unit 26″, a memory location in the I/O bit map register 62 is addressed. If this location contains a one, the output of the I/O select AND gate will be high, thereby enabling the RAM 24 through the enabling OR gate 74. The I/O four×sixteen word register file 60 selects the indicated group of memory locations as in the previous embodiment. As one can appreciate, the same four-bit input signal could select a different group of memory locations within the RAM 24 depending on how the two register files 32 and 60 have been configured or programmed. If the two register files 32 and 60 have been programmed identically, then there is no need for the two to one register file multiplexer 64. Similarly, the two bit map registers 34 and 62 can be programmed differently so that a single fifteen bit address can access two different RAM's and two different groups of word locations within an accessed RAM. Thus, the advantages of translating bus addresses so that physically discontiguous memory space may be accessed as contiguous bus addresses are extended to the use of an I/O device in this further embodiment. The I/O multiplexer disable register 76 operates in the same manner as the CPU multiplexer disable register file 37. In this embodiment, 290 memory locations control access to the 524,288 memory locations provided by the sixteen memory modules M1–M16. The seventeen additional memory locations required over those of the first embodiment are required by the sixteen I/O bit map registers and the I/O multiplexer disable register 76. The I/O four×sixteen word register file 60 is accessed as the upper byte of the same address that accesses the CPU four×sixteen word register file 32. Thus, by way of summary, a signal on the I/O select line 23 defines one of the word register files 32 or 60 and one of the bit map registers 34 or 62 to respond to incoming address requests. The CPU addresses are translated to access one set of physical memory space in the random access memories and I/O addresses are translated to access another set of physical memory space in the random access memories. These two sets of physical memory space may be the same, different, or partially overlap. Because the memory resource allocation logic is distributed within each memory module, a separate memory management controller is not necessary for the memory system provided by the invention.

Figure 5:
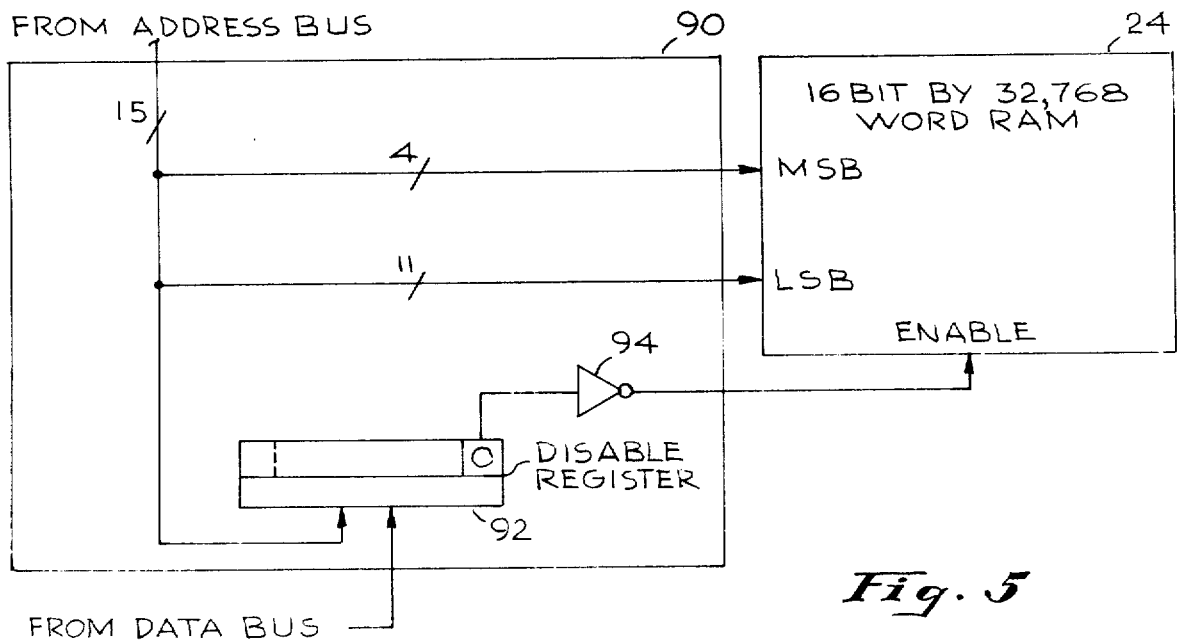
FIG. 5 is a block diagram of a modified memory module configured to initialize the other memory modules.

In accordance with a further feature of the invention, the first memory module M1 can be configured as shown in FIG. 5. The purpose of this alternate configuration is to allow its associated RAM 24 to provide initialization instructions for the other memory modules after power turn-on or a power drop-out. Here, an address translation logic unit 90 includes only a disable register 92 and an inverter 94. The fifteen address lines are provided directly to the RAM 24, and to the disable register 92. At power initialization, all of the memory locations in the disable register 92 are in a low or zero state, thus resulting in the RAM 24 being enabled due to the inverter 94. The RAM 24 can thus be directly accessed by the address bus 22, and information contained therein used to program the other four×sixteen word registers, bit map registers, and disable registers.

It should now be apparent that memory resource allocation using distributed address translation as provided by the present invention provides a means for addressing a memory system having more memory locations than can be defined by the number of available address bits. This is effected by defining a portion of the memory system which can be addressed by the available address bits, and then redefining the memory system portion which can be addressed as more memory is required during the execution of a program.

What is claimed is:

1. In a data processing system including a central processing unit coupled to a data bus and an m bit address bus, an improved memory system coupled to said data bus and address bus, comprising:

means for partitioning an m bit address into subsets of n bits and (m−n) bits;

$2^n$ memory modules each including up to $2^m$ memory locations;

$2^n$ substantially identical address translation units, each coupled to a different memory module and each including a map register containing $2^n$ locations, each map register location defining a first or second state;

enabling means responsive to said subset of n address bits for selecting one of said $2^n$ map register locations in each of said address translation units and for enabling the memory module coupled to an address translation unit containing a selected location defining a first state; and means responsive to an m bit address on said address bus for accessing one of the $2^m$ locations in said enabled memory module.

2. The data processing system of claim 1 wherein each of said map registers comprise one of said memory locations.

3. The data processing system of claim 1 wherein each of said address translation units includes $2^n$ word registers, each storing an n bit word;

means responsive to said subset of n address bits for selecting one of said $2^n$ word registers in each of said address translation units and for accessing the n bit word stored therein; and wherein said means for accessing one of said $2^m$ locations in said enabled memory module includes means responsive to said subset of (m−n) bits on said address bus and said n bit word accessed from said selected word register.

4. The data processing system of claim 3 wherein said $2^n$ memory modules include up to $2^{m+n}$ memory locations; and wherein each m bit address on said address bus identifies one of said $2^{m+n}$ memory locations.

5. The data processing system of claim 4 wherein each of said map registers and each of said word registers comprise one of said $2^{m+n}$ memory locations.

6. The data processing system of claim 5 wherein said central processing unit includes means for applying an m bit address to said address bus to provide access to one of said $2^{m+n}$ locations; and means for writing information into or reading information from each accessed location whereby said central processing unit can modify the information in said word registers and said map registers.

7. The data processing system of claim 1 wherein each of said address translation units includes a second map register;
an I/O select line; and
means responsive to a control signal on said I/O select line for causing said enabling means to be selectively responsive to either said first named map registers or said second map registers.

8. A memory system responsive to an m bit address for accessing one of up to $2^{m+n}$ memory locations, said system comprising:
$2^n$ memory modules each including up to $2^m$ memory locations;
$2^n$ substantially identical address translation units, each coupled to a different one of said memory modules;
each of said address translation units including a map register storing $2^n$ bits;
means responsive to n bits of said m bit address for selecting one of said $2^n$ bits in each of said map registers and for enabling the memory module associated with a selected bit having a first state;
each of said address translation units further including $2^n$ word registers, each storing an n bit word;
means responsive to said n bits of said m bit address for selecting one of said $2^n$ word registers in each of said address translation units and for accessing the n bit word stored therein; and
means responsive to m−n bits of said bit address and to the n bit word accessed from the word register of the address translation unit coupled to said enabled memory module for selecting one of said $2^m$ memory locations in said enabled memory module.

9. The memory system of claim 8 wherein each of said map registers is defined by one of said $2^{m+n}$ locations.

10. The memory system of claim 8 wherein each of said word registers is defined by one of said $2^{m+n}$ locations.

* * * * *